(12) United States Patent
Kang et al.

(10) Patent No.: US 9,978,460 B2
(45) Date of Patent: May 22, 2018

(54) MEMORY MODULE INCLUDING ON-DIE TERMINATION CIRCUIT AND CONTROL METHOD THEREOF

(71) Applicant: Samsung Electronics Co., Ltd., Suwon-si (KR)

(72) Inventors: Sukyong Kang, Suwon-si (KR); Hangi Jung, Hwaseong-si (KR); Hun-Dae Choi, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/384,843

(22) Filed: Dec. 20, 2016

(65) Prior Publication Data

US 2017/0178750 A1 Jun. 22, 2017

(30) Foreign Application Priority Data

Dec. 22, 2015 (KR) ........................ 10-2015-0183938

(51) Int. Cl.
| | |
|---|---|
| G11C 7/10 | (2006.01) |
| G11C 29/38 | (2006.01) |
| G11C 11/4074 | (2006.01) |
| G11C 11/4093 | (2006.01) |
| G11C 29/36 | (2006.01) |
| G06F 13/40 | (2006.01) |
| G11C 16/34 | (2006.01) |
| G11C 11/00 | (2006.01) |
| G11C 29/02 | (2006.01) |

(Continued)

(52) U.S. Cl.
CPC .......... *G11C 29/38* (2013.01); *G06F 13/4086* (2013.01); *G11C 7/1057* (2013.01); *G11C 7/1084* (2013.01); *G11C 11/005* (2013.01); *G11C 11/4074* (2013.01); *G11C 11/4093* (2013.01); *G11C 16/34* (2013.01); *G11C 29/025* (2013.01); *G11C 29/36* (2013.01); *G11C 29/50008* (2013.01); *G11C 5/04* (2013.01)

(58) Field of Classification Search
CPC ..... G11C 29/38; G11C 7/1057; G11C 7/1084; G11C 11/4074; G11C 11/4093; G11C 29/36; G06F 13/4086
USPC ........................................................ 365/191
See application file for complete search history.

(56) References Cited

U.S. PATENT DOCUMENTS

| | | | |
|---|---|---|---|
| 6,762,620 | B2 | 7/2004 | Jang et al. |
| 7,259,585 | B2 | 8/2007 | Brinkman et al. |
| 7,336,098 | B2 | 2/2008 | Wang et al. |

(Continued)

FOREIGN PATENT DOCUMENTS

| | | |
|---|---|---|
| KR | 10-2007-0024678 A | 3/2007 |
| KR | 10-2014-0123203 A | 10/2014 |

*Primary Examiner* — J. H. Hur
*Assistant Examiner* — Xiaochun L Chen
(74) *Attorney, Agent, or Firm* — Muir Patent Law, PLLC (57) ABSTRACT

A memory module includes a first memory device including a first one-die termination circuit for impedance matching of a signal path and a second memory device sharing the signal path with the first memory device and including a second on-die termination circuit for impedance matching of the signal path, wherein the signal path corresponds to a command or address signal path provided from a host, and the first and second on-die termination circuits are individually controlled according to control of the host.

17 Claims, 11 Drawing Sheets

(51) Int. Cl.
    *G11C 29/50*        (2006.01)
    *G11C 5/04*          (2006.01)

(56) References Cited

U.S. PATENT DOCUMENTS

| | | |
|---|---|---|
| 7,646,213 B2 | 1/2010 | Kao |
| 7,884,637 B2* | 2/2011 | Jeong .................. G11C 7/1051 |
| | | 326/26 |
| 7,915,924 B2 | 3/2011 | Waldrop |
| 8,041,865 B2 | 10/2011 | Bruennert et al. |
| 8,581,621 B2 | 11/2013 | Park |
| 8,619,492 B2 | 12/2013 | Jeon |
| 8,947,962 B2 | 2/2015 | Shaeffer et al. |
| 2009/0059704 A1* | 3/2009 | Jeong .................. G11C 7/1051 |
| | | 365/225.7 |
| 2014/0310481 A1 | 10/2014 | Chung et al. |

\* cited by examiner

MEMORY MODULE INCLUDING ON-DIE TERMINATION CIRCUIT AND CONTROL METHOD THEREOF

CROSS-REFERENCE TO RELATED APPLICATIONS

This US non-provisional patent application claims priority under 35 USC § 119 to Korean Patent Application No. 10-2015-0183938, filed on Dec. 22, 2015, the entirety of which is hereby incorporated by reference.

BACKGROUND

The present disclosure relates to memory systems and, more particularly, to a memory module including an on-die termination circuit and an on-die termination control method thereof.

A data signal transmitted along a transmission line of a memory system may be reflected at the termination end of the transmission line. The reflected data signal acts as a noise to have an influence on an original data signal and degrade the quality of the data signal. A termination resistor is connected to the terminal of the transmission line to prevent reflection of the data signal.

The termination resistor is a component used to reduce reflection of the data signal and to prevent lowering of quality of the data signal by matching between internal impedance and external impedance of a memory system. The termination resistor is typically used for a dynamic random access memory (DRAM) having high operating speed. Recently, to prevent signal interference between DRAMs, an ODT (On Die Termination) technique is typically used for connecting the termination resistor to the interior of the DRAM.

Since a DRAM has very high operating speed higher than 1000 MHz under DDR3 SDRAM (Double Data Rate 3 Synchronous DRAM) standards, higher quality and stability of the data signal are needed. If impedance is not matched due to variation in a value of the termination resistor depending on variation in a fabrication process, a power supply voltage, and an operation temperature, it is difficult to transmit a data signal at high speed. Thus, the data signal can be distorted.

A plurality of DRAMs included in a memory module may have different signal transmission characteristics according to their mounted positions, respectively. Accordingly, when these environmental factors are precisely compensated, accurate impedance matching may be possible in the memory system.

SUMMARY

The present disclosure relates to a memory module including an on-die termination circuit and an on-die termination circuit of the memory module.

Example embodiments provide a memory module. In some embodiments, the memory module may include a first memory device including a first one-die termination circuit for impedance matching of a signal path and a second memory device sharing the signal path with the first memory device and including a second on-die termination circuit for impedance matching of the signal path. The signal path may correspond to a command or address signal path provided from a host, and the first and second on-die termination circuits may be individually controlled according to control of the host.

Example embodiments provide an on-die termination control method of a memory module including a plurality of memory devices. Each of the memory devices may include a plurality of on-die termination circuits each connected to a corresponding pad of each of the memory devices. The on-die termination control method may include transferring a test signal from a first pad of a selected memory device, comparing the transferred test signal with a reference signal, activating an on-die termination circuit connected to the first pad based on a result of the comparison, and generating and storing a control code based on the activation of the on-die termination circuit.

Example embodiments provide an on-die termination control method of a memory module including a plurality of memory devices. The on-die termination control method may include selecting one of the memory devices, providing one or more signals of the selected memory device to a host through one or more corresponding signal lines, testing the one or more signals of the selected memory device, and determining whether an on-die termination circuit connected to each of the one or more signal lines is to be used for the selected memory device in subsequent communications with the host, according to a result of the test.

Example embodiments provide an on-die termination control method of a memory module including a plurality of memory devices. Each of the memory devices may include a plurality of on-die termination circuits. The on-die termination control method may include selecting one of the memory devices, providing one or more test signals of the selected memory device to a host through one or more corresponding signal lines, comparing each of the provided one or more test signals with a reference signal, activating an on-die termination circuit connected to each of the one or more signal lines based on a result of the comparison, and generating and storing a control code based on the activation of the on-die termination circuit.

BRIEF DESCRIPTION OF THE DRAWINGS

The forgoing and other features of inventive concepts will be described below in more detail with reference to the accompanying drawings of non-limiting example embodiments of inventive concepts in which like reference characters refer to like parts throughout the different views. The drawings are not necessarily to scale, emphasis instead being placed upon illustrating principles of inventive concepts. In the drawings.

DETAILED DESCRIPTION

Example embodiments will now be described more fully with reference to the accompanying drawings, in which some example embodiments are shown. Example embodiments may, however, be embodied in many different forms and should not be construed as being limited to the embodiments set forth herein. In the drawings, the dimensions and size of each structure are exaggerated, reduced, or schematically illustrated for convenience in description and clarity. Like reference characters and/or numerals in the drawings denote like elements, and thus their description may be omitted.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
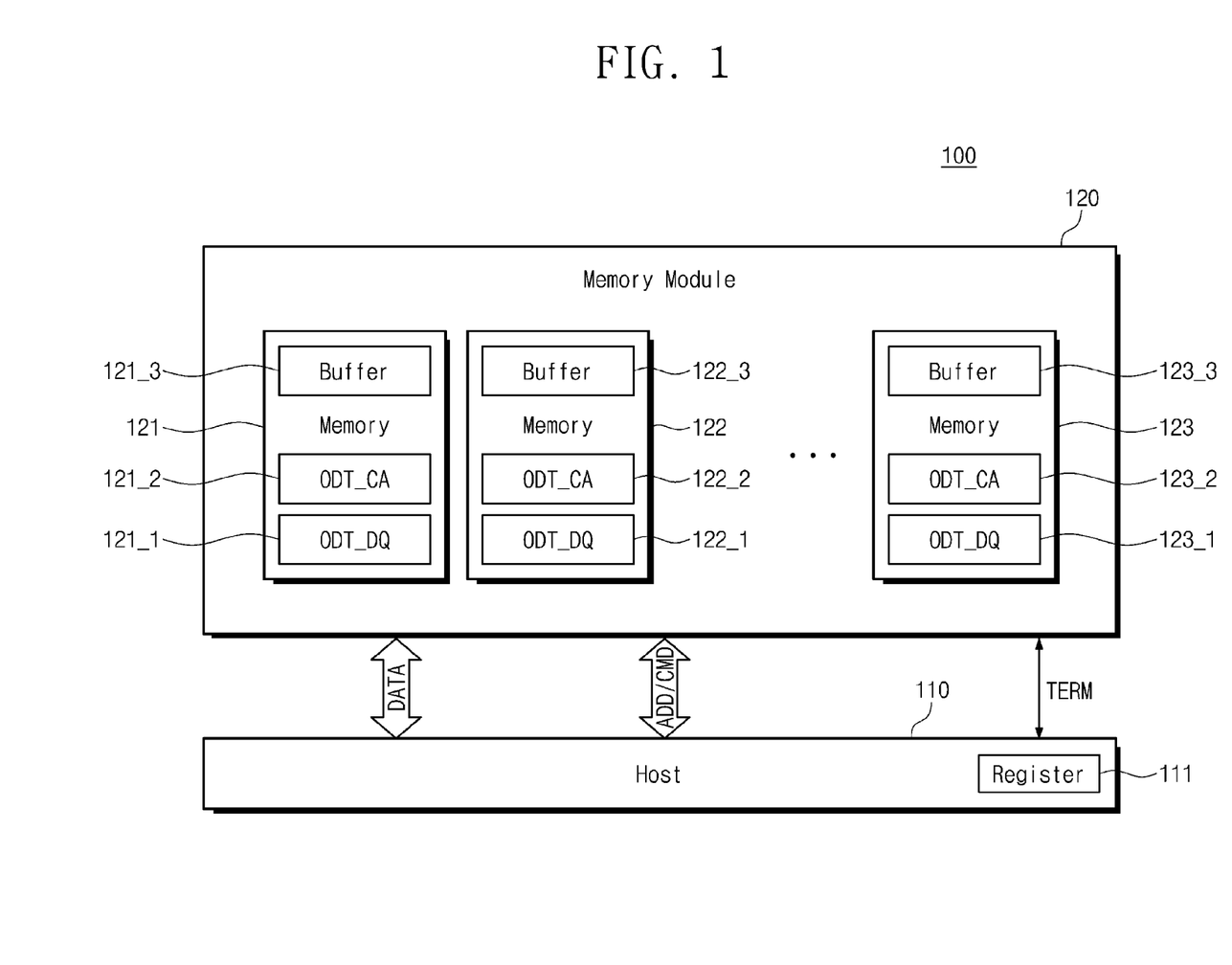
FIG. 1 is a block diagram of a memory system according to example embodiments.

FIG. 1 is a block diagram of a memory system 100 according to example embodiments. As illustrated, the memory system 100 may include a host 110 and a memory module 120.

The host 110 may include a register 111. The host 110 is connected to a plurality of memory devices 121 to 123. The host 110 exchanges a data signal with the memory devices 121 to 123 through ODT_DQ circuits 121_1 to 123_1. Each of the ODT_DQ circuits 121_1 to 123_1 may include a plurality of ODT_DQ circuits. The host 110 provides an address or command signal (ADD/CMD) to the memory devices 121 to 123 through ODT_CA circuits 121_2 to 123_2. Each of the ODT_CA circuits 121_2 to 123_2 may include a plurality of ODT_CA circuits. The host 110 may directly provide an address/command ADD/CMD signal to the memory devices 121 to 123 not through ODT_CA circuits 121_2 to 123_2. In example embodiments, the host 110 may exchange a control code TERM with the memory module 120 to control the ODT_CA circuits 121_2 to 123_2 (in this example, through use of the register 111).

The register 111 of the host 110 is connected to the memory module 120. The register 111 stores the control code TERM of the ODT_CA circuits 121_2 to 123_2 decided by the host 110. When the host 110 provides a signal to the memory devices 121 to 123, the register 111 provides the control code TERM to the ODT_CA circuits 121_2 to 123_2.

Although the register 111 is shown as part of the host, in other examples, the register 111 may be formed as part of the memory module 120 (e.g., mounted on printed circuit board of the memory module on which the memory devices 121 to 123 (e.g., memory chips and/or semiconductor packages comprising a plurality of memory chips) are also mounted). In example embodiments, the register 111 may be implemented with an electronic device (e.g., a buffer or a memory) distinct and separate from the memory devices 121 to 123 in the memory module 120. Alternatively, the register 111 may be implemented as being integrated into each of the memory devices 121 to 123 (e.g., parts of the register 111 may be formed in each of the memory devices 121 to 123).

The memory module 120 may include the memory devices 121 to 123. In example embodiments, the memory module 120 may exchange the control code TERM of the ODT_CA circuits 121_2 to 123_2 with the host 110 through the register 111. The memory module 120 may have various structures, which will be described in detail later with reference to FIGS. 9 to 11.

Each of the memory devices 121 to 123 may include a volatile memory including a dynamic random access memory (DRAM) and a static random access memory (SRAM), or a nonvolatile memory.

The volatile memory may include, for example, a DRAM, an SRAM, a thyristor RAM (TRAM), a zero-capacitor RAM (Z-RAM) or a twin resistor RAM (TTRAM).

The nonvolatile memory may be, for example, an electrically erasable programmable read-only memory (EEPROM), a flash memory, a magnetic RAM (MRAM), a spin-transfer torque MRAM (STT-MRAM), a conductive bridging RAM (CBRAIVI), a ferroelectric RAM (FeRAIVI), a phase change RAM (PRAM), a resistive RAM (RRAM), a nanotube RRAM, a polymer RAM (PoRAM), a nan-floating gate memory (NFGM), a holographic memory, a molecular electronics memory device or an insulator resistance change memory. One or more bits may be stored in a unit cell of the nonvolatile memory.

Each of the memory devices 121 to 123 may include ODT_DQ circuits 121_1 to 123_1, ODT_CA circuits 121_2 to 123_2, and buffers 121_1 to 123_3. Each of the buffers 121_1 to 123_3 may include a plurality of buffers (e.g., an input buffer, an output buffer, an address buffer, or a command buffer). For ease of description, description will be made on one memory device 121 among the memory devices 121 to 123. However, all features, operating methods, and structures that will be described may be applied to the other memory devices 122 and 123.

In general, a termination resistor may be connected to the end of a transmission line to prevent reflection of a signal and improve characteristics of the signal. Each of the ODT_DQ circuit 121_1 and the ODT_CA circuit 121_2 is a type of termination resistor as being integrated into the memory device 121. For example, each of the ODT_DQ circuit 121_1 and the ODT_CA circuit 121_2 is an ODT circuit of the memory device 121.

The ODT_DQ circuit 121_1 is connected to the host 110 and the buffer 121_3 (e.g., an input buffer or an output buffer) of the memory device 121. The ODT_DQ circuit 121_1 improves signal characteristics through impedance matching with a transmission line when exchanging data with the host 110.

The ODT_CA circuit 121_2 is connected to the host 110 and the buffer 121_3 (e.g., an address buffer or a command buffer). The ODT_CA circuit 121_2 may improve signal characteristics through impedance matching with a transmission line when receiving an address signal or a command signal from the host 110. The ODT_CA circuit 121_2 is controlled by the control code TERM when the host 110 provides a signal to the memory device 121. The ODT_CA circuit 121_2 may have various structures according to signal transmission manners. A detailed structure of the ODT_CA circuit 121_2 will be described in detail later with reference to FIGS. 5 to 8. For example, the ODT_CA circuit 121_2 may be implemented in the form of a device distinguished from the memory device 121 in the memory module 120. The buffer 121_3 transmits data, address, and command signals received from the host 110 to the interior of the memory device 121 after amplifying amplitude of the data, address, and command signals.

For example, each of the ODT_DQ circuits may be connected to a corresponding input/output pin (e.g., DQ pin) and each of the ODT_CA circuits may be connected to a corresponding address/command pin (e.g., ADD/CMD pin). Each ADD/CMD pin may be connected to receive command and address signals and transmit the same to a command/address buffer of its memory device (121, 122 or 123) to be decoded by a command decoder or address decoder (e.g., row decoder or column decoder) of the memory device. It will be appreciated that the use of the term "pin" herein generically refers to a terminal of a device (such as a terminal of the memory device 121, 122 or 123) and does not require the terminal comprises a prong type terminal. Exemplary pin structures include a prong, a pad and a bump (e.g., solder ball).

Operation of the memory system 100 will be described below. The host 110 decides a control code TERM of the ODT_CA circuits 121_2 to 123_2 for each of the memory devices 121 to 123. The host 110 stores the control code TERM in the register 111. A method for generating the control code TERM will be described in detail later with reference to FIGS. 2 to 4. When generation and storage of the control code TERM are completed, the host 110 performs a write or read operation. For example, it will be assumed that the host 110 selects one memory device 121 among the memory devices 121 to 123 to perform the above-mentioned operation.

In case of the write operation, the host 110 provides an active command and a row address together with a clock to the selected memory device 121. In this case, the host 110 may receive the control code TERM of the ODT_CA circuit 121_2 for the memory device 121 from the register 111 in synchronization with the active command. Then the host 110 decides whether or not to use the ODT_CA circuit 121_2 according to the control code TERM. When the ODT_CA circuit 121_2 is decided to be used, the host 110 turns on the ODT_CA circuit 121_2 (e.g., a first one of the ODT_CA circuit 121_2). After a period of time, the host 110 provides a write command and column address information together with a clock to the memory device 121. After a period of time, the ODT_CA circuit 121_2 is turned off. Next, after a period of time, the host 110 may turn on the ODT_DQ circuit 121_1 (e.g., a first one of the ODT_DQ circuit 121_1). Then the host 110 provides data to the memory device 121. The memory device 121 writes the provided data into a memory cell of a determined address.

Figure 2:
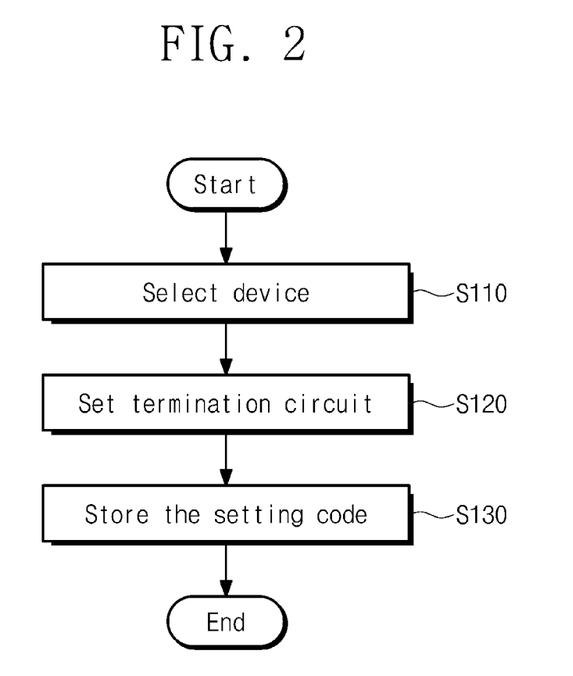
FIG. 2 is a flowchart summarizing a method for generating a control code of an ODT_CA circuit in FIG. 1 according to example embodiments.

In case of the read operation, the host 110 provides an active command and row address information together with a clock to the memory device 121. The host 110 turns on the ODT_CA circuit 121_2 (e.g., a first one of the ODT_CA circuit 121_2) through the same procedure as the above-described write operation. After a period of time, the host 110 provides a read command and a column address together with a clock to the memory device 121. Next, after a period of time, the host 110 turns off the ODT_CA circuit 121_2. Finally, after a period of time, the memory device 121 provides requested data to the host 110. That is, in case of the read operation, the ODT_DQ circuit 121_1 may not operate FIG. 2 is a flowchart summarizing a method for generating a control code of an ODT_CA circuit in FIG. 1 according to example embodiments. In the flowchart, each operation will be described with reference to the block diagram in FIG. 1. Referring to FIG. 2, the host 110 may generate a control code TERM of the ODT_CA circuits 121_2 to 123_2 for each of the memory devices 121 to 123.

In S110, the host 110 selects one memory device 121 among the memory devices 121 to 123. For example, the selected memory device 121 may be decided by two manners. First, it is assumed that the control code TERM of the ODT_CA circuits 121_2 to 123_2 as been determined for each of the memory devices 121 to 123 of the memory module 120 (the control code TERM may be different for each of the different memory devices 121 to 123). In this case, any one of the memory devices 121 to 123 may be selected irrespective of order. That is, as a result, a selection operation has only to be completed on all the memory devices 121 to 123. Thus, there is no restriction on selection order. However, one memory device 121 may be selected in the located order from the host 110 to achieve efficiency of operation.

Second, the host 110 may obtain the control code TERM of the ODT_CA circuits 121_2 to 123_2 only for the predetermined memory device 121. In general, degradation in signal quality of the memory module 120 may result from a small number of memory devices (e.g., a memory device 121) in the memory module 120. This may depend upon a mounted location of the memory device 121 (e.g., a mounting location on a printed circuit board of the memory module). Accordingly, estimating which of the memory device 121 contributes to degrade the signal transmission quality is possible before the memory module 120 is designed. For example, the host 110 may generate the control code TERM for only the ODT_CA circuit 121_2 of the memory device 121 predicted to be associated with poor transmission quality during communications with the host 110. Thus, the quality of the specific memory device 121 playing a main role in degrading the signal transmission quality in the memory module 120 may be improved. As a result, the signal transmission quality of the memory module 120 may be efficiently managed. In example embodiments, the host 110 may select one memory device 121 using location information of the memory devices 121 to 123.

In S120, a determination is made as to whether the ODT_CA circuits 121_2 to 123_2 are used for the selected memory device 121. The decision is made on the basis of the signal quality of the memory device 121, which will be described in detail later with reference to FIGS. 3 and 4. When use at least one of the ODT_CA circuits 121_2 to 123_2 is decided, the host 110 converts it into a control code TERM (logic '1' or logic '0').

In S130, the host 110 stores the control code TERM decided in S120 in the register 111. When a write or read operation performs, the host 110 receives the control code TERM from the register 111 to control operations of the ODT_CA circuits 121_2 to 123_2.

As mentioned above, the host 110 may obtain the control code TERM of the ODT_CA circuits 121_2 to 123_2 with respect to all the memory devices 121 to 123. For example, S110 to S130 are performed repeatedly on the unselected memory devices 122 and 123. In example embodiments, S110 to S130 may be performed during a booting sequence of the memory module 120. Alternatively, S110 to S130 may be performed in synchronization with a tag signal of the host 110.

Figure 3:
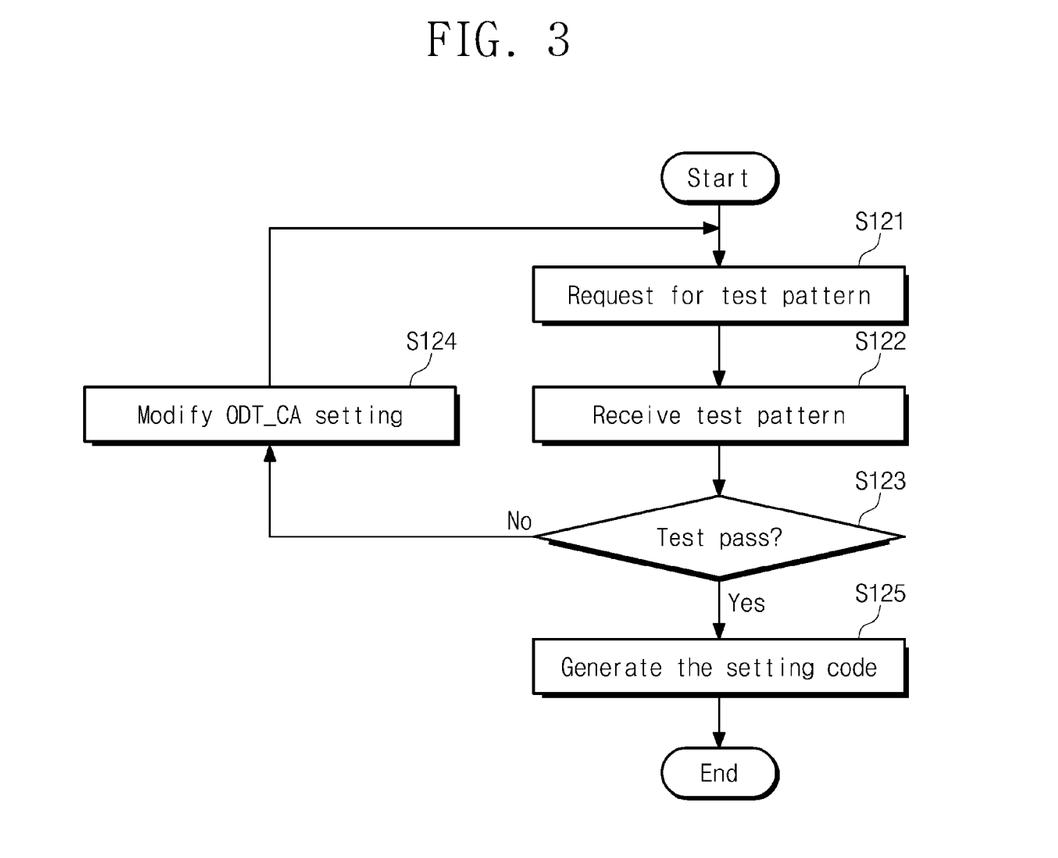
FIGS. 3 and 4 are flowcharts summarizing S120 shown in FIG. 2 according to example embodiments.
Figure 4:
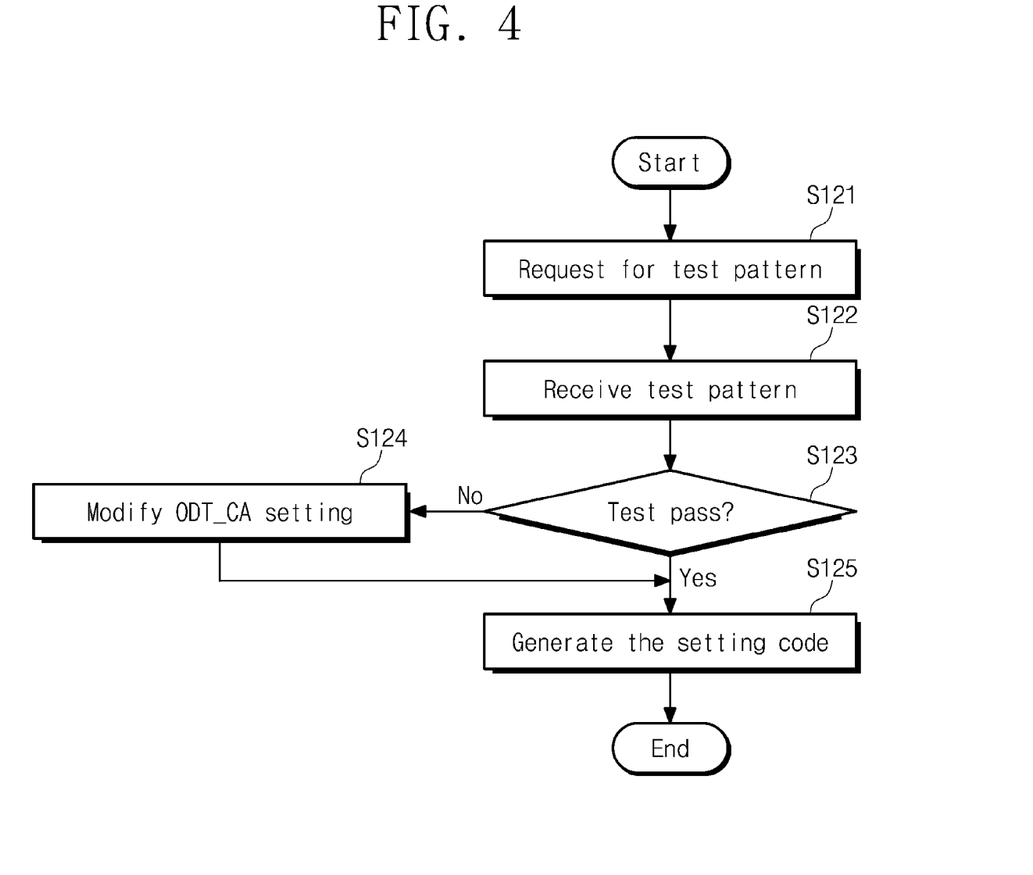

FIGS. 3 and 4 are flowcharts summarizing S120 shown in FIG. 2 according to example embodiments. Referring to FIG. 3, the control code TERM of the ODT_CA circuits 121_2 to 123_2 may be obtained such that the selected memory device 121 may have optimal transmission characteristics.

In S121, the host 110 requests a test pattern to the memory device 121 selected in S110 to test the signal quality for a first pin of the memory device 121. The memory device 121 receives the request and prepares the test pattern.

In S122, the memory device 121 provides the requested test pattern to the host 110. The provided test pattern is transferred to the host 110 through a transmission line (e.g., an address or a command signal line). The degradation in signal quality of the test pattern varies depending on transmission line length, impedance, reflected wave, and the like that vary depending on a location of the selected memory device 121. In example embodiments, the test pattern may be generated by a register or a random pattern generator included in each of the memory devices 121 to 123.

In S123, the host 110 may compare the signal quality of the provided test pattern with a reference quality. For example, the signal quality of the test pattern may be tested using a rank margin tool (RMT) value. When a measured signal quality value does not satisfy the reference quality (e.g., No direction), the host 110 may access the appropriate ODT_CA circuits 121_2 to 123_2 corresponding to the unsatisfactory quality to modify a setting of the ODT_CA circuits 121_2 to 123_2.

In S124, the host 110 modifies setting a first one of the ODT_CA circuit 121_2. The host 110 may provide a turn-on code to the first one of the ODT_CA circuit 121_2. In this case, the firstly selected ODT_CA circuit 121_2 may be one of the ODT_CA circuits 121_2 to 123_2. For example, the firstly selected ODT_CA circuit 121_2 may be an ODT_CA circuit 121_2 closest to the selected memory device 121 selected in S110 to efficiently improve the signal quality. This is because as the more the ODT_CA circuits 121_2 to 123_2 gets close to the selected memory device 121, the better impedance matching with a transmission line is made so that the reflected wave can be eliminated efficiently. After the ODT_CA circuit 121_2 is selected, the host 110 turns on the selected ODT_CA circuit 121_2 based on the turn-on code. Henceforth, the selected ODT_CA circuit 121_2 operates in synchronization with a signal that the host 110 provides to the memory device 121.

Subsequent procedure is the same as S121 to S124. After the ODT_CA circuit 121_2 for the first pin of the memory device 121 is set, the host 110 requests the same test pattern to the memory device 121 (S121) for a second pin of the memory device 121. The memory device 121 provides the test pattern to the host 110 (S122) through a transmission line. The host 110 compares the signal quality of the received test pattern with the reference quality (S123). When the signal quality does not satisfy the reference quality (e.g., No direction), the host 110 provides a turn-on signal to the ODT_CA circuit 121_2 (S124) (e.g., a second one of the ODT_CA circuit 121_2). The memory device 121 may provide a setting signal to the host 110 (S125). In this case, the selected second ODT_CA circuit 122_2 may be an ODT_CA circuit 122_2 adjacent to the first ODT_CA circuit 121_2. The host 110 repeatedly performs S121 to S124 until a point of time at which the signal quality of all the ADD/CMD pins of the memory device 121 satisfies the reference quality. When the memory device 121 for all the ADD/CMD pins passes a signal quality test in S123 (e.g., Yes direction), the host 110 performs S125.

In S125, the host 110 generates the control code TERM of the ODT_CA circuit 121_2. The host 110 converts setting information of the ODT_CA circuit 121_2 when the selected memory device 121 passes the signal quality test into the control code TERM. The generated control code TERM is stored in the register 111 (S130). And then, the host 110 may perform S121 to S125 for unselected memory devices (e.g., memory devices 122 to 123).

In example embodiments, in S121, the host 110 may simultaneously request test patterns to the memory device 121 to test the signal quality for all the ADD/CMD pins of the memory device 121. In this case, in S122, the memory device 121 may simultaneously provide the requested test patterns to the host 110 through transmission lines. In S123, the host 110 may simultaneously compare the signal quality of each of the provided test patterns with the reference quality. In S124, the host 110 modifies setting one by one of the ODT_CA circuit 121_2 when the memory device 121 does not pass a signal quality test in S123 (e.g., No direction). When the memory device 121 passes a signal quality test in S123 (e.g., Yes direction), the host 110 may perform S125. And then, the host 110 may perform S121 to S124 for unselected memory devices (e.g., memory devices 122 to 123).

Referring to FIG. 4, the control code TERM of the single ODT_CA circuit 121_2 for the selected memory device 121 may be obtained. In FIG. 4, S121 to S125 are same as those in FIG. 3. Unlike the case of FIG. 3, the host 110 preforms a signal quality test of the selected memory device 121 only once.

The host 110 receives a test pattern from the selected memory device 121 (S121 and S122). The host 110 performs the signal quality test (S123). When a result value of the signal quality test is smaller than or equal to a reference quality value (e.g., No direction), the host 110 modifies setting of the ODT_CA circuit 121_2. That is, the host 110 provides a turn-on code to the ODT_CA circuit 121_2 (S124) and generates a control code TERM for the ODT_CA circuit 121_2 without repeating S121 through S123. Meanwhile, when the result value of the signal quality test is greater than the reference quality value in S123 (e.g., Yes direction), the host 110 does not modify setting of the ODT_CA circuit 121_2 and generates the control code TERM for the ODT_CA circuit 121_2 (S125).

As compared to the method in FIG. 3, the method in FIG. 4 may reduce time required to obtain a control code. Moreover, a size of the register 111 is reduced because information about use of one ODT_CA circuit 121_2 for an individual memory device 121 is allocated to a control code.

Figure 5:
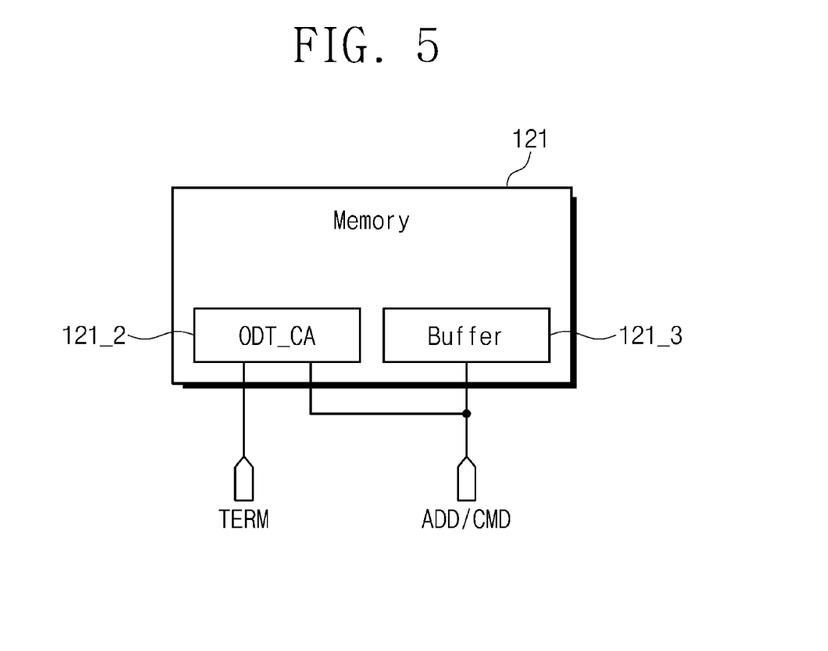
FIG. 5 is a block diagram illustrating a connection relationship between a buffer and the ODT_CA circuit shown in FIG. 1 according to example embodiments.

FIG. 5 is a block diagram illustrating a connection relationship between the buffer 121_3 (e.g., an address buffer or a command buffer) and the ODT_CA circuit 121_2 shown in FIG. 1 according to example embodiments. Referring to FIG. 5, the ODT_CA circuit 121_2 operates in synchronization with a control code TERM when receiving an address signal or a command signal from the host 110. The control code TERM is provided to the ODT_CA circuit 121_2 from the register 111 after synchronization with a command of the host 110.

Figure 6:
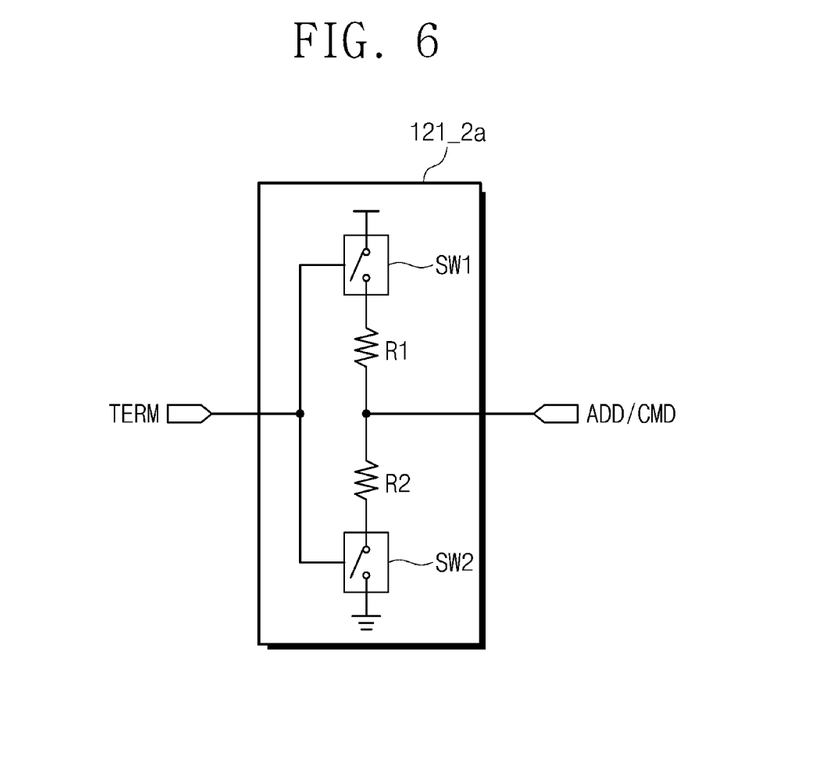
FIGS. 6 to 8 are circuit diagrams of the ODT_CA circuit shown in FIG. 1 according to example embodiments.
Figure 7:
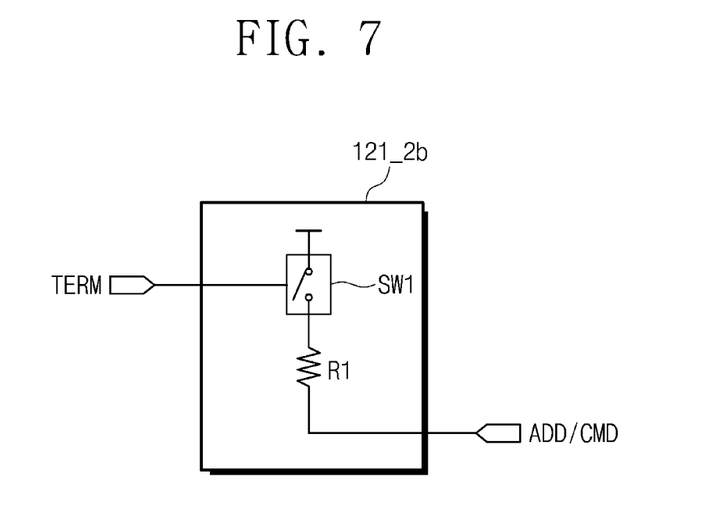
Figure 8:
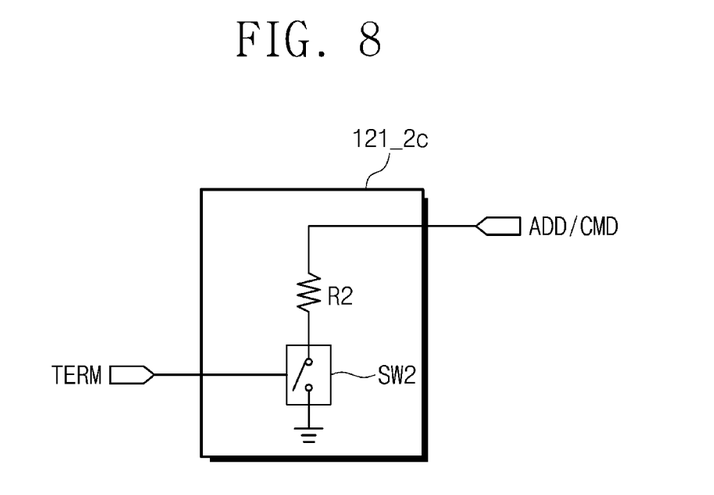

FIGS. 6 to 8 are circuit diagrams of the ODT_CA circuit 121_2 shown in FIG. 1 according to example embodiments. Operation of the ODT_CA circuit 121_2 will be described with reference to the block diagrams in FIGS. 1 and 5.

Referring to FIG. 6, the ODT_CA circuit 121_2 may have a center tap termination (CTT) configuration. A CTT-type ODT_CA circuit 121_2a may include a plurality of termination resistors R1 and R2 and a plurality of switches SW1 and SW2. One end of the first switch SW1 is connected to a power supply voltage. The other end of the first switch SW1 is connected to one end of the first termination resistor R1. One end of the second switch SW2 is connected to a ground voltage. The other end of the second switch SW2 is connected to one end of the second termination resistor R2. The first termination resistor R1 is coupled between the first switch SW1 and an input terminal of the buffer 121_3. The second termination resistor R2 is coupled between the second switch SW2 and the input terminal of the buffer 121_3.

Operation of the CTT-type ODT_CA circuit 121_2a will now be described. When a signal ADD/CMD is provided to the buffer 121_3 through an input terminal, the CTT-type ODT_CA circuit 121_2a receives a control code TERM from the register 111. The first and second switches SW1 and SW2 are switched in response to the control code TERM. According to a result of the switching, the first and second termination resistors R1 and R2 are connected or not connected to the power supply voltage and ground voltage. In example embodiments, the control code may include separate codes provided to the first and second switches SW1 and SW2.

Referring to FIG. 7, the ODT_CA circuit 121_2 may have a pseudo open drain (POD) configuration. A POD-type ODT_CA circuit 121_2b may include a switch SW1 and a termination resistor R1 coupled between a power supply voltage and an input terminal of a buffer 121_3. Unlike the CTT-type ODT_CA circuit 121_2a in FIG. 6, the POD-type ODT_CA circuit 121_2b includes only one switch SW1 and only one termination resistor R1 disposed in a power supply voltage unit. For example, an operation of the POD-type ODT_CA circuit 121_2b may be the same as that of the CTT-type ODT_CA circuit 121_2a and will not be described in further detail.

When the buffer 121_3 has a differential input manner to receive the input signal ADD/CMD and a reference signal (not shown), the level of a predetermined reference signal may have different values according to a termination manner. When a POD-type termination manner is applied, a voltage level of a transmission line to which the signal ADD/CMD is transmitted has a relatively high value. Thus, the level of the reference signal may also have a relatively high value (e.g., a voltage level between a power supply voltage and half the power supply voltage).

Referring to FIG. 8, the ODT_CA circuit may have a low voltage swing terminated logic (LVSTL) configuration. An LVSTL-type ODT_CA circuit 121_2c may include a switch SW2 and a termination resistor R2 coupled between a ground voltage and a buffer 121_3. Unlike the CTT-type ODT_CA circuit 121_2a in FIG. 6, the LVSTL-type ODT_CA circuit 121_2c includes only one switch SW2 and only one termination resistor R2 disposed in a ground voltage unit. For example, an operation of the LVSTL-type ODT_CA circuit 121_2c may be the same as that of the CTT-type ODT_CA circuit 121_2a and will not be described in further detail. When an LVSTL-type termination manner is applied, the level of a reference signal may have a relatively low value (e.g., a voltage level between half a power supply voltage and a ground voltage).

Each of the ODT_CA circuits 121_2a to 121_2C shown in FIGS. 6 to 8 may include only one switch and only one termination resistor between a voltage signal (a power supply voltage or a ground voltage) and a buffer 121_3. However, example embodiments are not limited to the above. In example embodiments, a plurality of switches and a plurality of termination resistors may be coupled in parallel between an input signal ADD/CMD and the power supply voltage or the ground voltage. Thus, an equivalent resistance value of the ODT_CA circuit 121_2 is variable and may be adjusted precisely. For example, the register 111 may generate a control code TERM to include 2 bits or more to control a plurality of switches. In example embodiments, variation of the resistance value may be performed by receiving a control signal from an external device such as a memory module 120 or a host 110.

In example embodiments, when each of the ODT_CA circuits 121_2 to 123_2 includes a plurality of switches and a plurality of termination resistors, in the step S124 of FIG. 3 the host 110 may modify setting the ODT_CA circuit by a value of the bits of the control code TERM. Thus, an impedance of a signal line connected to the ODT_CA circuit may be adjusted precisely such that signal transmission characteristics are improved.

For brevity of description, the description has been given with respect to only one memory device 121 among the plurality of memory devices 121 to 123. However, all the described characteristics, operating methods, and structures may be applied to the other memory devices 122 and 123.

Figure 9:
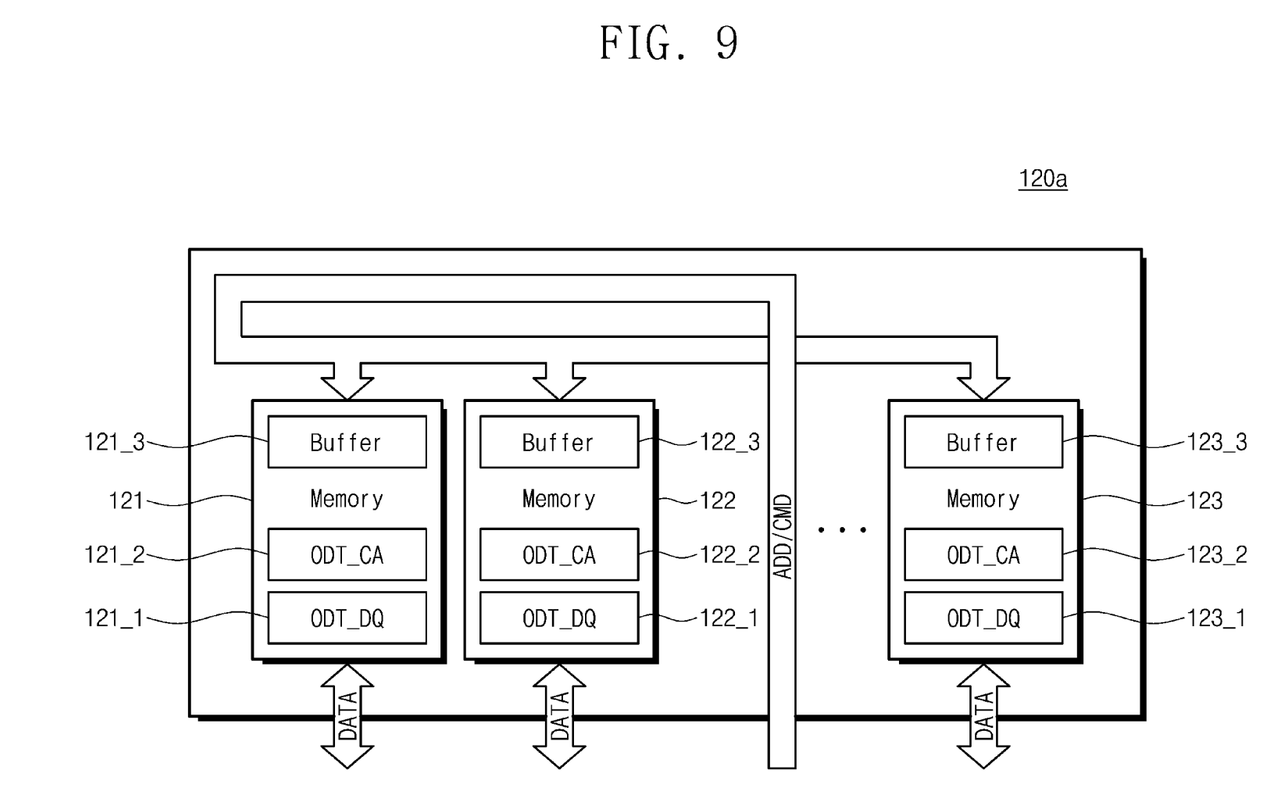
FIGS. 9 to 11 are block diagrams of a memory module shown in FIG. 1 according to example embodiments.
Figure 10:
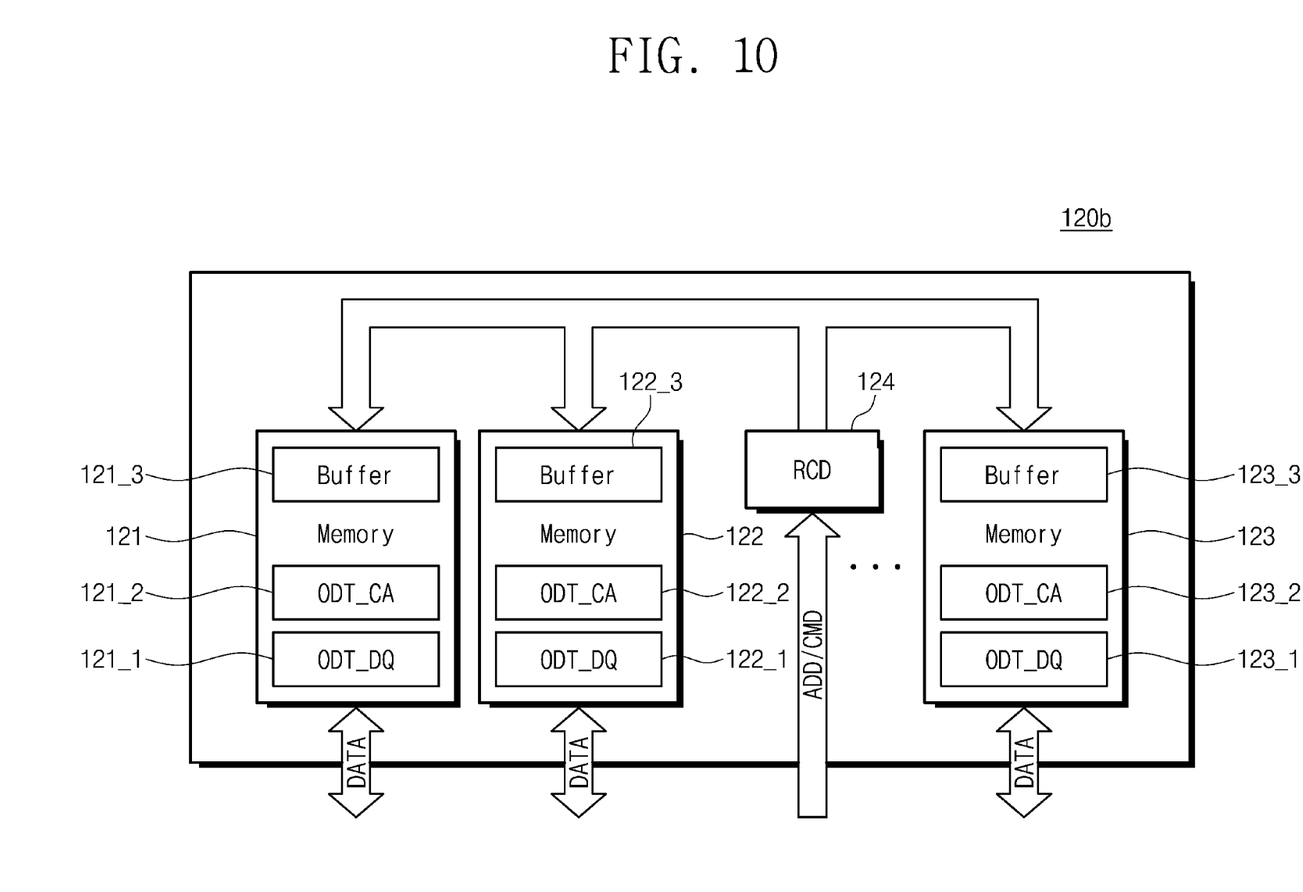
Figure 11:
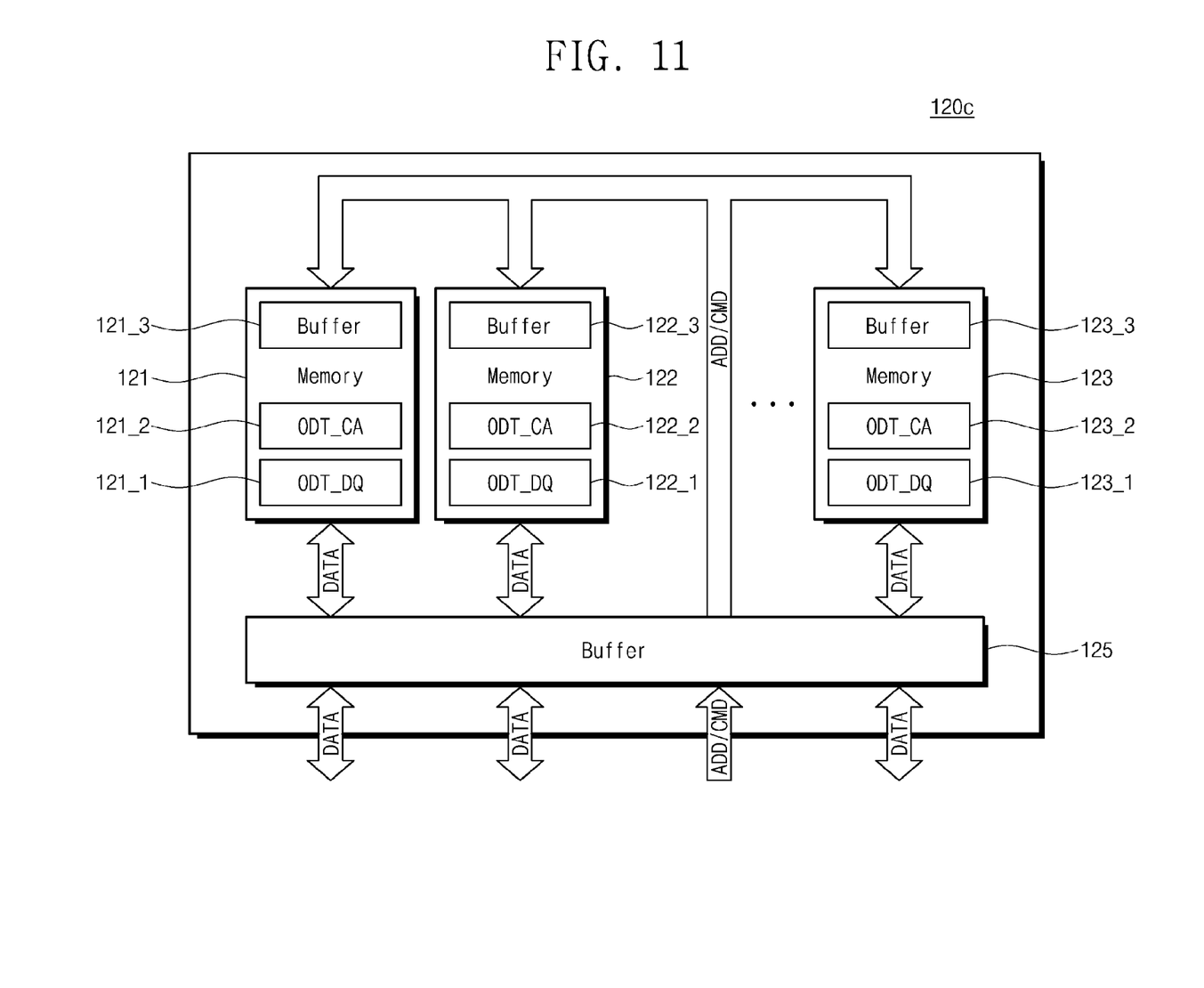

FIGS. 9 to 11 are block diagrams of the memory module 120 shown in FIG. 1 according to example embodiments. The memory module 120 may have a dual in-line memory module (DIMM) type configuration. Also the memory module 120 may have various DIMM configurations according to variable purposes. The memory module 120 will now be described below in detail.

Referring to FIG. 9, the memory module 120 shown in FIG. 1 may be an A-type memory module 120a having an unbuffered DIMM (UDIMM) configuration. The A-type memory module 120a may include a plurality of memory devices 121 to 123, ODT_DQ circuits 121_1 to 123_1, ODT_CA circuits 121_2 to 123_2, and buffers 121_3 to 123_3. Each of the memory devices 121 to 123 of FIG. 9 may be the same as or similar to configuration of each of the memory devices 121 to 123 in FIG. 1. In this and other embodiments, each of the memory devices (e.g., 121 to 123) may be a single semiconductor memory chip that is part of a package of a plurality of memory chips (e.g., a stack of memory chips). ODT_CA and ODT_DQ described herein may be formed as part of the semiconductor chip, between a terminal of the semiconductor chip (e.g., chip pad) and the appropriate buffer of the semiconductor chip.

In the UDIMM configuration, a host 110 directly exchanges data and provide a clock, and a command with/to the memory devices 121 to 123 when the host 110 accesses the memory devices 121 to 123. For example, each of the memory devices 121 to 123 exchanges data with the host 110 through an individual transmission line. For example, the memory devices 121 to 123 receive an address or command signal from the host 110 through a shared transmission line. Since transmission speed of a data signal is higher than that of the address or command signal, ways to transmit signals are different from each other. An operation of the A-type memory module 120a may be the same as that of the above-described memory module 120 in FIG. 1 and will not be described in further detail. Thus, a control code TERM for controlling the ODT_CA circuits 121_2 to 123_2 may be provided by the register 111 included in the host 110.

Referring to FIG. 10, the memory module 120 shown in FIG. 1 may be a B-type memory module 120b having a registered DIMM (RDIMM) configuration. The B-type memory module 120b may include a plurality of memory devices 121 to 123, ODT_DQ circuits 121_1 to 123_1, ODT_CA circuits 121_2 to 123_2, buffers 121_3 to 123_3, and a register clock driver (RCD) 124. Each of the memory devices 121 to 123 of FIG. 10 may be the same as or similar to configuration of each of the memory devices 121 to 123 in FIG. 1. The memory devices 121 to 123 are connected to the RCD 124. The RCD 124 serves as a buffer of an address or a command transmitted from the host 110 to the memory devices 121 to 123 to reduce a load of an output unit of the host 110.

In the RDIMM configuration, the host 110 directly exchanges data with each of the memory devices 121 to 123 through an individual transmission line when the host 110 accesses the memory devices 121 to 123. Meanwhile, the host 110 provides an address or a command to each of the memory devices 121 to 123 through the RCD 124. For example, the address or the command is provided to each of the memory devices 121 to 123 through a shared transmission line. An operation of the B-type memory module 120*b* may be the same as that of the above-described memory module 120 and will not be described in further detail. In example embodiments, a control code TERM for controlling the ODT_CA circuits 121_2 to 123_2 may be stored in the RCD 124 of the memory module 120*b*.

Referring to FIG. 11, the memory module 120 shown in FIG. 1 may be a C-type memory module 120*c* having a load reduced DIMM (LRDIMM) configuration. The C-type memory module 120*c* may include a plurality of memory devices 121 to 123, ODT_DQ circuits 121_1 to 123_1, ODT_CA circuits 121_2 to 123_2, buffers 121_3 to 123_3, and a buffer 125. Each of the memory devices 121 to 123 of FIG. 11 may be the same as or similar to configuration of each of the memory devices 121 to 123 in FIG. 1. The memory devices 121 to 123 are connected to the buffer 125. The buffer 125 serves to reduce a load of an output unit of the host 110.

In the LRDIMM configuration, the host 110 indirectly exchanges data and provide a command, and an address with/to the memory devices 121 to 123 through the buffer 125 when the host 110 accesses the memory devices 121 to 123. For example, the host 110 exchanges data with each of the memory devices 121 to 123 through an individual transmission line through the buffer 125. Meanwhile, an address or a command is provided to the memory devices 121 to 123 through a shared transmission line through the buffer 125. An operation of the C-type memory module 120*c* may be the same as that of the above-described memory module 120 and will not be described in further detail. In example embodiments, a control code TERM for controlling the ODT_CA circuits 121_2 to 123_2 may be stored in the buffer 125 of the memory module 120*c*.

In example embodiments, the ODT_CA circuits 121_2 to 123_2 in the above-described A-type to C-type memory modules 120*a* to 120*c* may be implemented with an electronic device distinguished from the memory devices 121 to 123 in the memory module 120.

Figure 12:
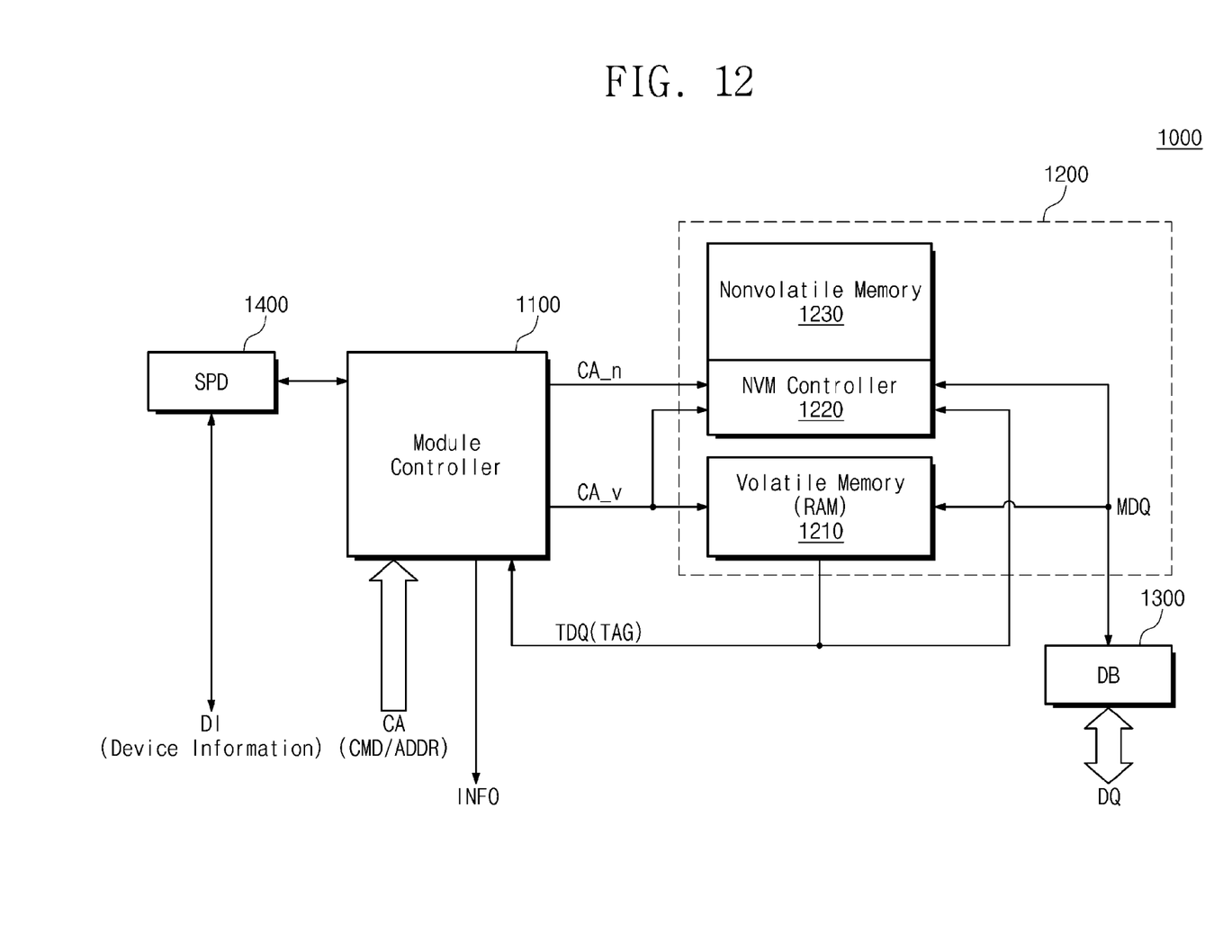
FIG. 12 is a block diagram of a nonvolatile memory module to which a memory module according to example embodiments of inventive concepts is applied.

FIG. 12 is a block diagram of a nonvolatile memory module 1000 to which a memory module according to certain embodiments is applied. As illustrated, the nonvolatile memory module 1000 may include a module controller 1100, a heterogeneous memory device 1200, a data buffer 1300, and a serial presence detect (SPD) chip 1400.

The module controller 1100 may receive a command/address CA from a host (not shown) and control the heterogeneous memory device 1200 in response to the received command/address CA.

The heterogeneous memory device 1200 includes a volatile memory 1210, an NVM controller 1220, and a nonvolatile memory 1230. The volatile memory 1210 may operate in response to a VM command/address CA_v received from the module controller 1100. The volatile memory 1210 may output data and a tag TAG through a memory data line MDQ and a tag data line TDQ in response to the VM command/address CA_v, respectively. The volatile memory 1210 may write the data received through the memory data line MDQ and the tag TAG received through the tag data line TDQ according to the VM command/address CA_v.

In example embodiments, the volatile memory 1210 may be a plurality of memory devices 121 to 123 including ODT_CA circuits 121_2 to 123_2 described with reference to FIGS. 1 to 8. Alternatively, the volatile memory 1210 may operate based on an operating method of the memory devices 121 to 123 described with reference to FIGS. 1 to 8.

The NVM controller 1220 may operate in response to an NVM command/address CA_n received from the module controller 1100. The NVM controller 1220 may perform various operations such as garbage collection, wear-leveling, and address translation to control the nonvolatile memory 1230.

The data buffer 1300 may receive data through the memory data line MDQ and provide the received data to the host (not shown) through the data line DQ. Alternatively, the data buffer 1300 may receive data through the data line DQ and output the received data through the memory data line MDQ. In example embodiments, the memory data line MDQ may be a data transmission path between components (e.g., a volatile memory, a nonvolatile memory, a data buffer, etc.) included in the nonvolatile memory module 1000 and the data line DQ may be a data transmission path between the nonvolatile memory module 1000 and the host (not shown). The tag data line TDQ may be a transmission path to transmit and receive the tag TAG.

The SPD chip 1400 may be an electrically erasable programmable read-only memory (EEPROM). The SPD chip 1400 may include initial information or device information (DI) of the nonvolatile memory module 1000.

Figure 13:
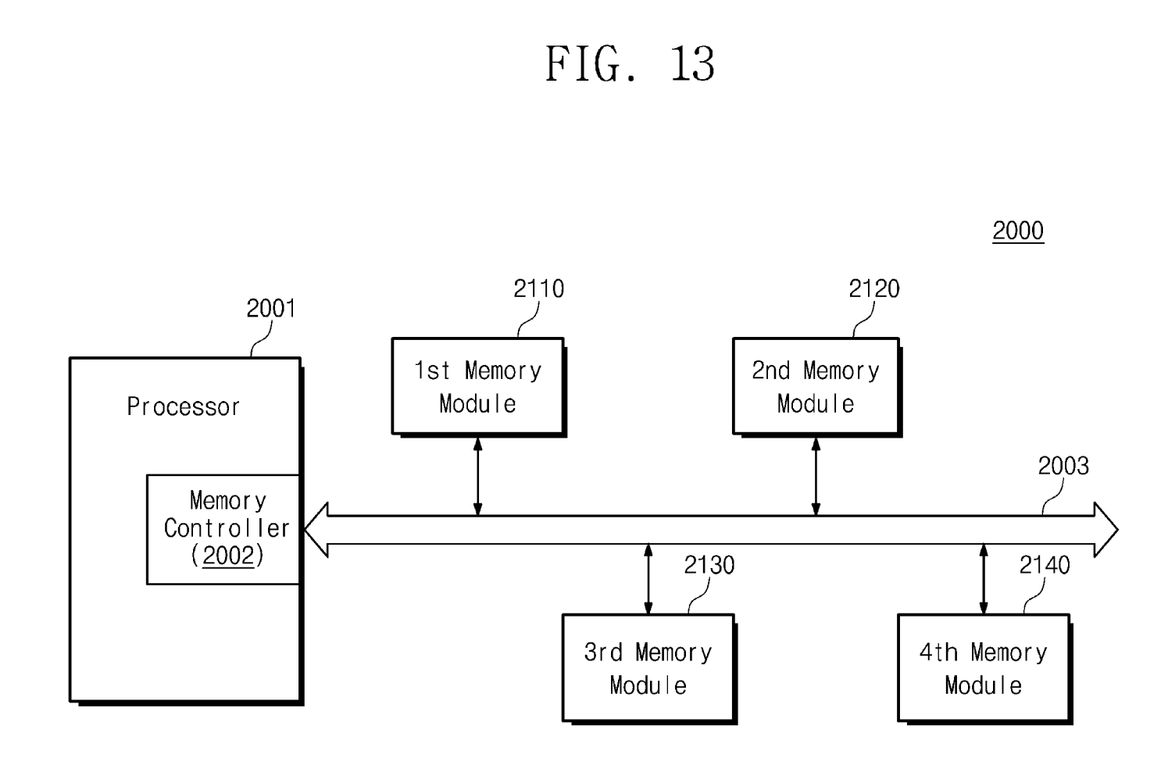
FIG. 13 is a block diagram of a user system to which a memory module according to example embodiments of inventive concepts is applied.

FIG. 13 is a block diagram of a user system 2000 to which a memory module according to certain embodiments is applied. As illustrated, the user system 2000 may include a host 2001 and a plurality of memory modules 2110 to 2140.

The host 2001 may include a memory controller 2002. The memory controller 2002 may communicate with a plurality of memory modules 2110 to 2140 through a bus 2003. In example embodiments, at least some of the memory modules 2110 to 2140 may be a memory module described with reference to FIGS. 1 to 11 or may operate based on an operating method described with reference to FIGS. 1 to 11. In example embodiments, at least some of the memory modules 2110 to 2140 may include a nonvolatile memory and the others may include a volatile memory. A memory module including a volatile memory may be used as a cache memory of a memory module including a nonvolatile memory.

As described above, an on-die termination circuit may be individually controlled with respect to each of a plurality of memory devices to improve the signal transmission quality of a memory device disposed at a position where signal transmission characteristics are poor in design, i.e., improve the signal transmission quality of a memory module including the plurality of memory devices.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims.

What is claimed is:

1. An on-die termination control method of a memory module including a plurality of memory devices, the method comprising:
    selecting one of the memory devices;
    testing one or more signals of the selected memory device; and
    determining whether an on-die termination circuit connected to each of one or more corresponding signal lines is to be used for the selected memory device in subsequent communications with a host, based on a result of the test.

2. The method of claim 1, wherein each of the one or more corresponding signal lines is commonly connected to the plurality of memory devices.

3. The method of claim 2, wherein each of the one or more signals provided through the one or more corresponding signal lines includes address and command signals.

4. The method of claim 1, wherein in the selecting one of the memory devices, the one memory device is selected based on information of a location of the selected memory device in the memory module.

5. The method of claim 1, further comprising:
    generating a control code based on whether the on-die termination circuit is used, and storing the generated control code.

6. The method of claim 5, wherein determining whether the on-die termination circuit is to be used for the selected memory device includes controlling the on-die termination circuit in response to the control code.

7. The method of claim 1, wherein testing the one or more signals of the selected memory device includes comparing each of the one or more signals with a reference signal.

8. The method of claim 1, wherein in the determining, a determination is made as to whether at least one of an on-die termination circuit of the selected memory device and an on-die termination circuit of an unselected memory device is to be used for the selected memory device, based on a result of the testing.

9. The method of claim 1, wherein selecting one of the memory devices, testing the one or more signals of the selected memory device, and determining whether an on-die termination circuit is to be used for the selected memory device are individually performed on each of the memory devices.

10. The method of claim 1, wherein selecting one of the memory devices, testing the one or more signals of the selected memory device, and determining whether an on-die termination circuit is to be used for the selected memory device are performed in synchronization with a tag signal of the host.

11. The method of claim 1, wherein selecting one of the memory devices, testing the one or more signals of the selected memory device, and determining whether an on-die termination circuit is used for the selected memory device are performed during a booting operation of the memory devices.

12. An on-die termination control method of a memory module including a plurality of memory devices, each of the memory devices including a plurality of on-die termination circuits, the method comprising:
    a) selecting one of the memory devices;
    b) providing one or more test signals of the selected memory device to a host through one or more corresponding signal lines;
    c) comparing each of the provided one or more test signals with a reference signal;
    d) activating an on-die termination circuit connected to each of the one or more corresponding signal lines based on a result of the comparison; and
    e) generating and storing a control code based on the activation of the on-die termination circuit.

13. The method of claim 12, further comprising:
    repeating a) through e) for unselected memory devices of the memory module.

14. The method of claim 13, wherein each of the on-die termination circuits is responsive to a corresponding control code.

15. The method of claim 12, wherein storing the control code performs by using a register included in the host or in the memory module.

16. The method of claim 12, further comprising:
    storing information of a location of each of the memory devices of the memory module.

17. The method of claim 12, wherein each of the one or more test signals includes address and command signals.

* * * * *